(12) United States Patent
Fujita et al.

(10) Patent No.: US 11,394,376 B2
(45) Date of Patent: Jul. 19, 2022

(54) CROSSTALK CANCELLATION CIRCUIT, TRANSMITTER, AND TRANSMISSION AND RECEPTION SYSTEM

(71) Applicant: THINE ELECTRONICS, INC., Tokyo (JP)

(72) Inventors: Yusuke Fujita, Tokyo (JP); Satoshi Miura, Tokyo (JP); Tetsuya Iizuka, Tokyo (JP); Daigo Takahashi, Tokyo (JP); Norihiko Nakasato, Tokyo (JP)

(73) Assignee: THINE ELECTRONICS, INC., Tokyo (JP)

( * ) Notice: Subject to any disclaimer, the term of this patent is extended or adjusted under 35 U.S.C. 154(b) by 0 days.

(21) Appl. No.: 16/997,076

(22) Filed: Aug. 19, 2020

(65) Prior Publication Data
US 2021/0058078 A1 Feb. 25, 2021

(30) Foreign Application Priority Data
Aug. 23, 2019 (JP) .............................. JP2019-152624

(51) Int. Cl.
| | | |
|---|---|---|
| H04B 1/04 | (2006.01) | |
| H03K 5/1252 | (2006.01) | |
| H03F 3/193 | (2006.01) | |
| H03K 5/00 | (2006.01) | |

(52) U.S. Cl.
CPC ........... *H03K 5/1252* (2013.01); *H03F 3/193* (2013.01); *H04B 1/0475* (2013.01); *H03F 2200/451* (2013.01); *H03K 2005/00078* (2013.01)

(58) Field of Classification Search
CPC .................. H03F 3/193; H03K 5/1252; H03K 2005/00078; H04B 1/0475; H04B 3/20; H04B 3/32; H04B 3/462; H04B 3/487; H04L 25/02; H04L 25/06; H04L 25/08; H04M 9/08

USPC ................ 330/252, 260; 370/201, 281, 286; 375/219, 295–297, 316; 379/406.1

See application file for complete search history.

(56) References Cited

U.S. PATENT DOCUMENTS

| | | | |
|---|---|---|---|
| 9,166,650 B2 | 10/2015 | Wilson et al. | |
| 2007/0064923 A1* | 3/2007 | Schmukler | H03H 11/265 |
| | | | 379/406.1 |
| 2019/0305819 A1* | 10/2019 | Jeong | H04B 3/32 |

OTHER PUBLICATIONS

Cosimo Aprile et al., "An Eight-Lane 7-GB/s/pin Source Synchronous Single-Ended RX With Equalization and Far-End Crosstalk Cancellation for Backplane Channels", IEEE Journal of Solid-State Circuits, 2018, (12 pages total).

* cited by examiner

*Primary Examiner* — Shawkat M Ali
(74) *Attorney, Agent, or Firm* — Sughrue Mion, PLLC

(57) ABSTRACT

An XTC circuit includes delay circuits, differentiated signal generating circuits, and an amplitude adjusting and adding circuit. A signal Da, which is one aggressor signal, is input to the differentiated signal generating circuit after being delayed by the delay circuit, and the differentiated signal generating circuit generates a differentiated signal having a differentiated waveform of the signal Da. In the amplitude adjusting and adding circuit, the differentiated signal generated by the differentiated signal generating circuit is amplitude-adjusted to become a current signal, and the differentiated signal after the amplitude adjustment is current-added to the signal Db.

13 Claims, 14 Drawing Sheets

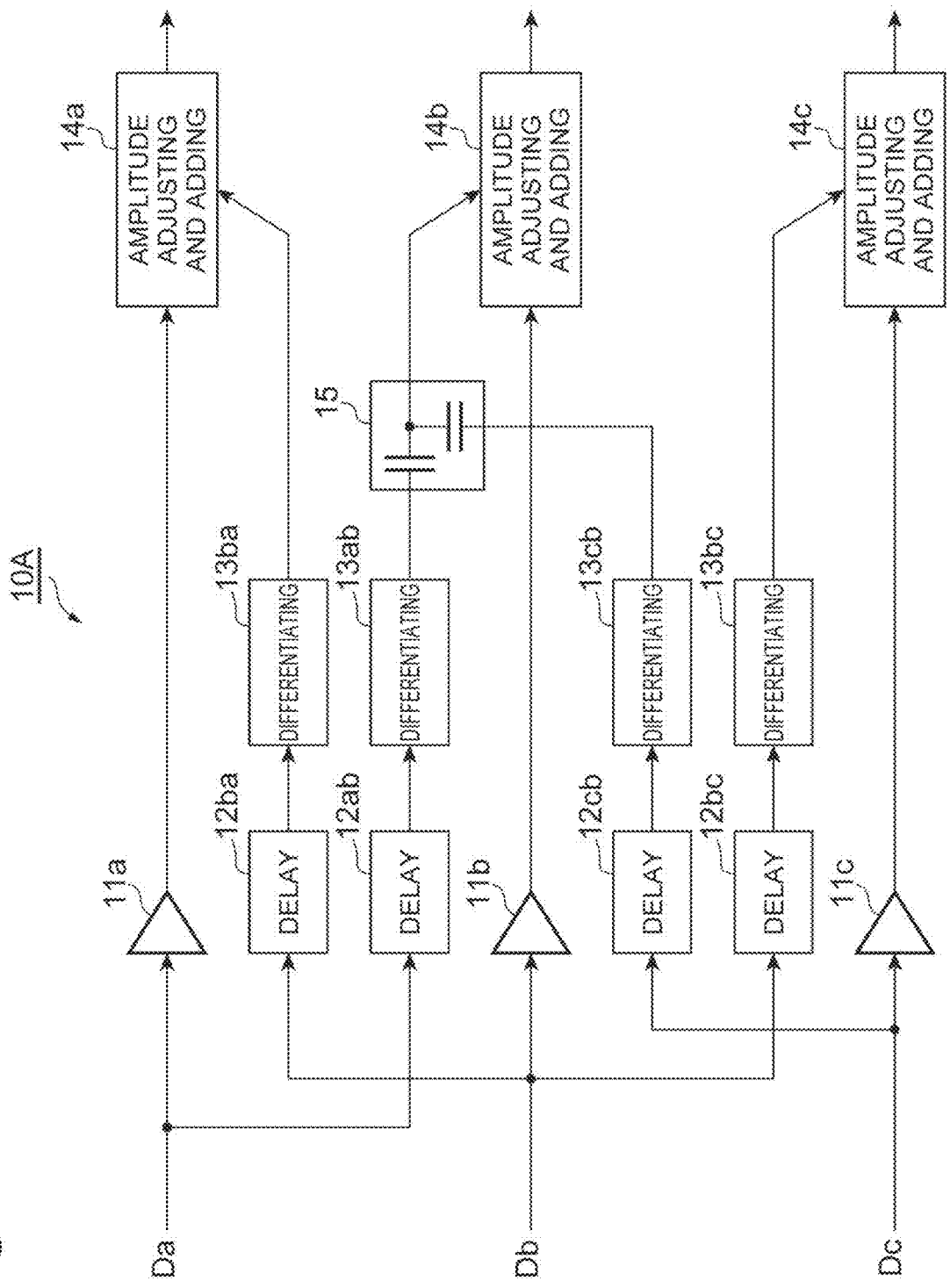

CROSSTALK CANCELLATION CIRCUIT, TRANSMITTER, AND TRANSMISSION AND RECEPTION SYSTEM

TECHNICAL FIELD

The present invention relates to a crosstalk cancellation circuit, a transmitter, and a transmission and reception system.

BACKGROUND

In a transmission and reception system including a transmitter and a receiver, a plurality of signal lines may be provided in parallel between the transmitter and the receiver. For example, a flexible flat cable (FFC) has a plurality of signal lines arranged in parallel at predetermined intervals, and is often used in a device, such as a television receiver. When signal lines are arranged in parallel, due to crosstalk generated between the adjacent signal lines, noise caused by the signal transmitted through the adjacent signal line is superimposed on the signal transmitted through each signal line. The magnitude (noise amplitude) of far-end crosstalk (FEXT) at the time of reaching the receiver depends on the length of the signal line and the interval of the parallel arrangement. The longer the signal line, the larger the noise amplitude of FEXT. In addition, the narrower the interval between the signal lines arranged in parallel, the larger the noise amplitude of FEXT.

Between the signals transmitted through the adjacent signal lines, the signal on which noise is superimposed due to the influence of crosstalk is called a victim signal, and the signal that gives the influence of crosstalk to the victim signal is called an aggressor signal. In addition, since crosstalk occurs bidirectionally between signals transmitted through adjacent signal lines, each signal can be either a victim signal or an aggressor signal.

The aggressor signal and the noise superimposed on the victim signal due to crosstalk from the aggressor signal travel in parallel at the same speed and simultaneously reach the receiver. Therefore, the amplitude of the noise superimposed on the victim signal increases as the noise travels along the signal line. However, the noise width is approximately the same as the rise time or fall time of the aggressor signal, and there is substantially no change during traveling along the signal line. The waveform of noise superimposed on the victim signal can be approximated by a waveform whose amplitude and delay are adjusted with respect to the differentiated waveform of the aggressor signal.

As the speed of signal transmission in a transmission and reception system increases, the problem of crosstalk increases. For example, a serial signal is transmitted between a controller and a display driver in a television receiver, and the speed of signal transmission in the television receiver increases due to an increase in the resolution, such as 4K or 8K. The ITC that is often used in the television receiver has a characteristic that the signal attenuation increases as the speed increases, and the signal voltage and the noise voltage of the FEXT at the receiving end have approximately the same magnitude. This reduces the signal transmission margin and increases the cost. Thus, as the signal transmission speed increases, it becomes important to cancel the crosstalk.

As a technique for crosstalk cancellation (XTC), Literature 1 "Cosimo Aprile, et al, "An Eight-Lane 7-Gb/s/pin Source Synchronous Single-Ended RX With Equalization and Far-End Crosstalk Cancellation for Backplane Channels," IEEE Journal of Solid-State Circuits, vol. 53, No. 3, pp. 861-872, March 2018" and Literature "U.S. Pat. No. 9,166,650" are known.

SUMMARY

A crosstalk cancellation circuit (XTC circuit) capable of performing suitable crosstalk cancellation (XTC) will be examined.

First, as a first technique of XTC as in Literature 1, a technique of removing noise superimposed on a victim signal in a receiver can be considered. In the first technique, a differentiated signal having a differentiated waveform of the aggressor signal reaching the receiver is generated by a high pass filter, and the amplitude of the differentiated signal is adjusted to generate simulated noise that is superimposed on the victim signal reaching the receiver. Then, the noise superimposed on the victim signal is canceled by using the generated simulated noise. By providing such an XTC circuit in the receiver to minimize the bit error rate measurement value of the victim signal after the XTC circuit, the XTC setting (amplitude adjustment) can be optimized according to the magnitude of crosstalk (the length and interval of the signal lines).

In the first technique, in order to perform XTC with higher accuracy, it is necessary to perform phase matching between the noise superimposed on the victim signal and the simulated noise generated from the aggressor signal. However, it is difficult to realize a delay circuit for adjusting the phase of noise that is an analog signal. A method of adjusting the phase of noise using a gain equalizer can be considered, but this is not preferable because a large amount of power is consumed.

Next, as a second technique of XTC as in Literature 2, a technique can be considered in which noise, which is superimposed on a victim signal at the time of reaching the receiver, is added to the victim signal in advance in the transmitter. In the second technique, in the transmitter, after delaying the aggressor signal by the delay circuit, a differentiated signal having a differentiated waveform of the aggressor signal is generated by a high pass filter and the amplitude of the differentiated signal is adjusted to generate simulated noise. Then, the simulated noise is added to the victim signal, and the victim signal to which the simulated noise has been added is transmitted from the transmitter. It is easy to realize a delay circuit for delaying the aggressor signal that is a digital signal.

In the second technique, it is necessary to determine a delay amount and an amplitude adjustment amount when generating the simulated noise from the aggressor signal in the transmitter by grasping the waveform of the noise superimposed on the victim signal at the time of reaching the receiver. In the case of a closed system such as a television receiver, the delay amount and the amplitude adjustment amount can be determined when the system is designed. The second technique is effective at the time of high-speed signal transmission in a closed device.

In the XTC circuit, an aggressor signal is input to a driver by using a capacitive coupling driver in which a capacitor is provided in series at the output terminal of the driver. A method can also be considered in which the output impedance of a driver and a capacitor connected in series thereto serve as a high pass filter to generate a differentiated signal having a differentiated waveform of the aggressor signal. In addition, by making the capacitance value of the capacitor variable, it is possible to adjust the amplitude of the differentiated signal. Then, the simulated noise after the amplitude adjustment can be added to the victim signal by capacitive coupling.

Compared with the first technique of performing XTC on the receiver side, the second technique of performing XTC on the transmitter side is preferable in that the phase adjustment of simulated noise can be easily performed. However, in a case where a T-coil is provided at the output terminal of the transmitter, the second technique requires the T-coil as follows.

The T-coil provided at the output terminal of the transmitter can cancel the load capacitance (for example, the capacitance of an ESD protection diode and the like) at the output terminal to reduce the return loss or the insertion loss of the output of the transmitter. As a result, the output signal hand of the transmitter can be enlarged. In high-speed signal transmission exceeding about 10 Gbps, the output signal band is reduced if the XTC circuit is provided in the transmitter. Therefore, in order to prevent this, it is necessary to provide a T-coil. Since the XTC circuit of the second technique described above has a large load capacitance at the output terminal, a T-coil is provided for high-speed signal transmission.

The inductance of the T-coil is designed to have an optimum value according to the magnitude of the load capacitance to be canceled. However, in the XTC circuit of the second technique described above, when the capacitance value of the capacitor is changed for amplitude adjustment, the inductance of the T-coil may not be optimal. As a result, the normal signal characteristic due to the T-coil may not be sufficiently improved. As described above, it is difficult to improve both the normal signal characteristics and the XTC characteristics by the T coil.

The disclosure shows a crosstalk cancellation circuit (XTC circuit) capable of performing suitable crosstalk cancellation (XTC) even when a T-coil is provided at the output terminal. In addition, the invention provides a transmitter including such an XTC circuit and a transmission and reception system including such a transmitter and a receiver.

The crosstalk cancellation circuit (XTC circuit) is an XTC circuit provided in a transmitter for transmitting a plurality of signals to a receiver through a plurality of signal lines, and includes: (1) a delay circuit that adjusts a phase of a first signal (aggressor signal) among the plurality of signals; (2) a differentiated signal generating circuit that generates a differentiated signal having a differentiated waveform of the first signal phase-adjusted by the delay circuit; and (3) an amplitude adjusting and adding circuit that adjusts an amplitude of the differentiated signal generated by the differentiated signal generating circuit to obtain the differentiated signal after the amplitude adjustment as a current signal, current-adds the differentiated signal after the amplitude adjustment to a second signal (victim signal) among the plurality of signals, and outputs the second signal after the addition. In addition, each of the plurality of signals may be a single end signal or differential signals.

It is preferable that the amplitude adjusting and adding circuit includes a plurality of amplifiers each having an input terminal, through which a voltage signal is input, and an output terminal, through which a current signal corresponding to the voltage signal is output at the time of ON setting and is not output at the time of OFF setting, and that the amplitude adjusting and adding circuit inputs the differentiated signal generated by the differentiated signal generating circuit to the input terminal of each of the plurality of amplifiers, current-adds a sum of the current signals output from the output terminals of the plurality of amplifiers to the second signal, and sets an amplitude adjustment amount of the differentiated signal by setting ON/OFF of each of the plurality of amplifiers.

Each of the plurality of amplifiers may include: a current source provided between a first potential terminal and the output terminal; a MOS transistor provided between a second potential terminal and the output terminal; and a capacitor provided between a gate of the MOS transistor and the input terminal. Alternatively, each of the plurality of amplifiers may include: a PMOS transistor provided between a power supply potential terminal and the output terminal; an NMOS transistor provided between a ground potential terminal and the output terminal; a first capacitor provided between a gate of the PMOS transistor and the input terminal; and a second capacitor provided between a gate of the NMOS transistor and the input terminal. In addition, one of the first potential terminal and the second potential terminal is a power supply potential terminal, and the other is a ground potential terminal. In addition, each of the input/output signals may comprise differential signals, and a pair of the circuit configurations may be provided in this case.

When the input voltage signal comprises differential signals including a first voltage signal and a second voltage signal, and the output current signal comprises differential signals including a first current signal and a second current signal, each of the plurality of amplifiers may have the following circuit configuration. Each of the plurality of amplifiers may include: a first current source provided between a first potential terminal and a first output terminal through which the first current signal is output; a second current source provided between the first potential terminal and a second output terminal through which the second current signal is output; a third current source connected to a second potential terminal; a first MOS transistor that has a gate connected to a first input terminal, through which the first voltage signal is input, and is provided between the third current source and the first output terminal; and a second MOS transistor that has a gate connected to a second input terminal, through which the second voltage signal is input, and is provided between the third current source and the second output terminal. In addition, one of the first potential terminal and the second potential terminal is a power supply potential terminal, and the other is a ground potential terminal.

Alternatively, when the input voltage signal comprises differential signals including a first voltage signal and a second voltage signal, and the output current signal comprises differential signals including a first current signal and a second current signal, each of the plurality of amplifiers may have the following circuit configuration. Each of the plurality of amplifiers includes: a first current source connected to a power supply potential terminal; a second current source connected to a ground potential terminal; a first PMOS transistor that has a gate connected to a first input terminal, through which the first voltage signal is input, and is provided between the first current source and a first output terminal, through which the first current signal is output; a second PMOS transistor that has a gate connected to a second input terminal, through which the second voltage signal is input, and is provided between the first current source and a second output terminal, through which the second current signal is output; a first NMOS transistor that has a gate connected to the first input terminal and is provided between the second current source and the first output terminal; and a second NMOS transistor that has a gate connected to the second input terminal and is provided between the second current source and the second output terminal.

A transmitter in the disclosure includes the above-described crosstalk cancellation circuit of the invention. A transmission and reception system of the invention includes the transmitter described above; and a receiver that receives a plurality of signals from the transmitter.

According to the invention, suitable crosstalk cancellation can be performed even when a T-coil is provided at the output terminal.

BRIEF DESCRIPTION OF DRAWINGS

FIG. 8A illustrates a case without crosstalk, FIG. 8B illustrates a case where there is crosstalk but XTC is not performed, and FIG. 8C illustrates a case where there is crosstalk and XTC is performed.

FIG. 9 is a diagram illustrating the configuration of an XTC circuit 10A.

DESCRIPTION OF EMBODIMENTS

Figure 1:
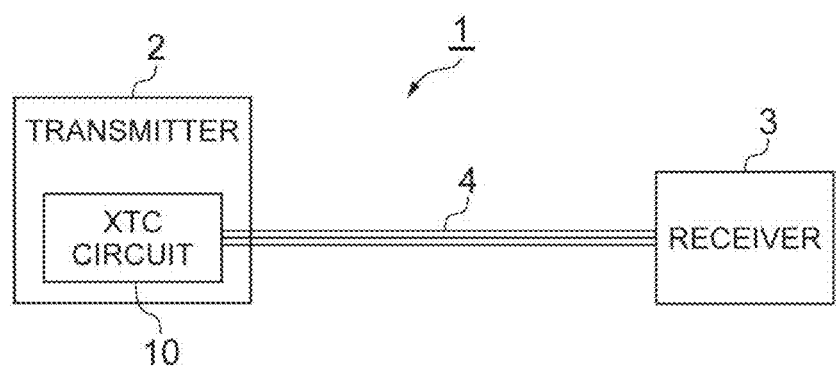
FIG. 1 is a diagram illustrating the configuration of a transmission and reception system 1.

Hereinafter, embodiments for carrying out the invention will be described in detail with reference to the accompanying diagrams. In the description of the diagrams, the same elements are denoted by the same reference numerals, and the repeated description thereof will be omitted. The invention is not limited to these examples, but is defined by the claims, and is intended to include all modifications within the scope and meaning equivalent to the claims.

FIG. 1 is a diagram illustrating the configuration of a transmission and reception system 1. The transmission and reception system 1 includes a transmitter 2 and a receiver 3. Signal lines 4 are provided in parallel between the transmitter 2 and the receiver 3. The transmission and reception system 1 transmits a plurality of signals from the transmitter 2 to the receiver 3 through the plurality of signal lines 4. The signal lines 4 are arranged in parallel at predetermined intervals, and are, for example, a flexible flat cable (FTC).

Such a transmission and reception system is found in a device, such as a television receiver. In this example, a parallel signal (video signal) is converted into a serial signal in a controller (transmitter), and the serial signal is transmitted from the controller to a display driver (receiver) through the signal lines. Then, the driver converts the serial signal into a parallel signal, and an image is displayed on the display based on the parallel signal.

The transmitter 2 includes an XIV circuit 10 (crosstalk cancellation circuit). The XTC circuit 10 cancels crosstalk between signals transmitted through the plurality of signal lines 4 (in particular, signals transmitted through adjacent signal lines). The XTC circuit 10 generates noise, which is to be superimposed on the victim signal at the time of reaching the receiver 3, based on the aggressor signal, and adds the generated noise to the victim signal in advance.

The victim signal is a signal on which noise is superimposed due to the influence of crosstalk. The aggressor signal is a signal that gives the influence of the crosstalk to the victim signal. Each signal can be either a victim signal or an aggressor signal.

Figure 2:
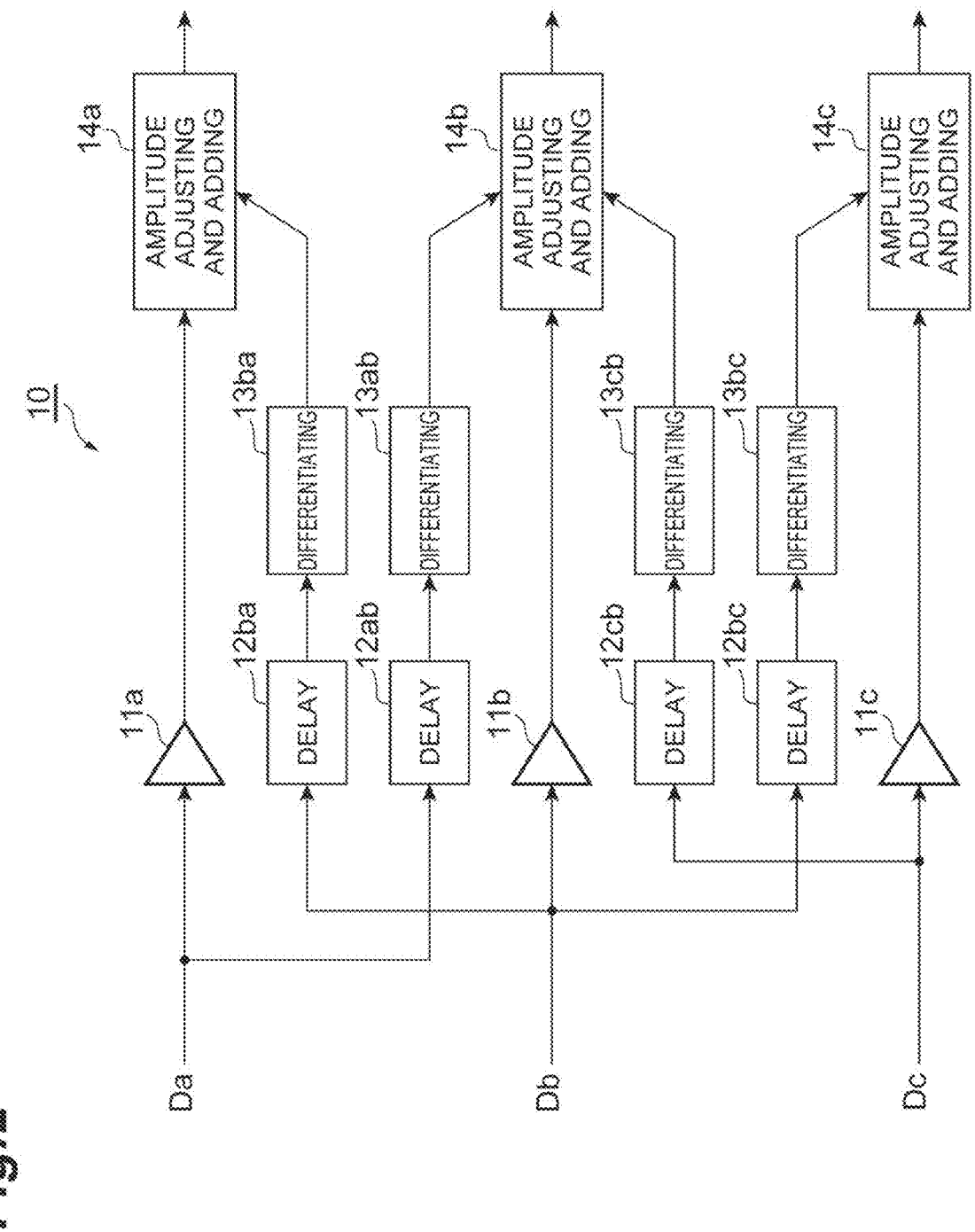
FIG. 2 is a diagram illustrating the configuration of an XTC circuit 10.

FIG. 2 is a diagram illustrating the configuration of the XTC circuit 10. FIG. 2 illustrates a case where XTC is performed between three signals Da, Db, and Dc. It is assumed that three signal lines for transmitting the three signals Da, Db, Dc are arranged in order and crosstalk between adjacent signal lines is canceled.

Assuming that the signal Db transmitted through the central signal line among the three signal lines is a victim signal, the signals Da and Dc transmitted through the two adjacent signal lines is aggressor signals. At this time, the signal Da, which is one aggressor signal, is input to a differentiated signal generating circuit 13*ab* after being delayed (phase adjusted) by a delay circuit 12*ab*, and the differentiated signal generating circuit 13*ab* generates a differentiated signal having a differentiated waveform of the signal Da. The signal Dc, which is the other aggressor signal, is input to a differentiated signal generating circuit 13*cb* after being delayed (phase adjusted) by a delay circuit 12*cb*, and the differentiated signal generating circuit 13*cb* generates a differentiated signal having a differentiated waveform of the signal Dc.

The signal Db, which is a victim signal, is input to an amplitude adjusting and adding circuit 14*b* after passing through a buffer 11*b*. In the amplitude adjusting and adding circuit 14*b*, the differentiated signal generated by the differentiated signal generating circuit 13*ab* is amplitude-adjusted to become a current signal and the differentiated signal generated by the differentiated signal generating circuit 13*cb* is amplitude-adjusted to become a current signal, and the differentiated signals after the two amplitude adjustments are current-added to the signal Db.

Assuming that the signal Da is a victim signal, the signal Db is an aggressor signal. The signal Db, which is an aggressor signal, is input to a differentiated signal generating circuit 13*ba* after being delayed (phase adjusted) by a delay circuit 12*ba*, and the differentiated signal generating circuit 13*ba* generates a differentiated signal having a differentiated waveform of the signal Db. The signal Da, which is a victim signal, is input to the amplitude adjusting and adding circuit 14*a* after passing through the buffer 11*a*. In the amplitude adjusting and adding circuit 14*a*, the differentiated signal generated by the differentiated signal generating circuit 13*ba* is amplitude-adjusted to become a current signal, and the differentiated signal after the amplitude adjustment is current-added to the signal Da.

Assuming that the signal Dc is a victim signal, the signal Db is an aggressor signal. The signal Db, which is an aggressor signal, is input to a differentiated signal generating circuit 13bc after being delayed (phase adjusted) by a delay circuit 12bc, and the differentiated signal generating circuit 13bc generates a differentiated signal having a differentiated waveform of the signal Db. The signal Dc, which is a victim signal, is input to an amplitude adjusting and adding circuit 14c after passing through a buffer 11c. In the amplitude adjusting and adding circuit 14c, the differentiated signal generated by the differentiated signal generating circuit 13bc is amplitude-adjusted to become a current signal, and the differentiated signal after the amplitude adjustment is current-added to the signal Dc.

The buffers 11a, 11b, and 11c can have a common configuration. The delay circuits 12ab, 12ba, 12bc, and 12cb can have a common configuration, and will hereinafter be referred to as a delay circuit 12. The differentiated signal generating circuits 13ab, 13ba, 13bc, and 13cb can have a common configuration, and will hereinafter be referred to as a differentiated signal generating circuit 13. The amplitude adjusting and adding circuits 14a and 14c can have a common configuration. The common configuration is basically the same configuration. The amplitude adjusting and adding circuit 14b can have the same configuration as the amplitude adjusting and adding circuit 14a and 14c even though the number of differentiated signals for current addition is different from that of the amplitude adjusting and adding circuits 14a and 14c. Therefore, the amplitude adjusting and adding circuit 14b will hereinafter be referred to as an amplitude adjusting and adding circuit 14. Specific circuit configuration examples of the delay circuit 12, the differentiated signal generating circuit 13, and the amplitude adjusting and adding circuit 14 will be described below.

Figure 3:
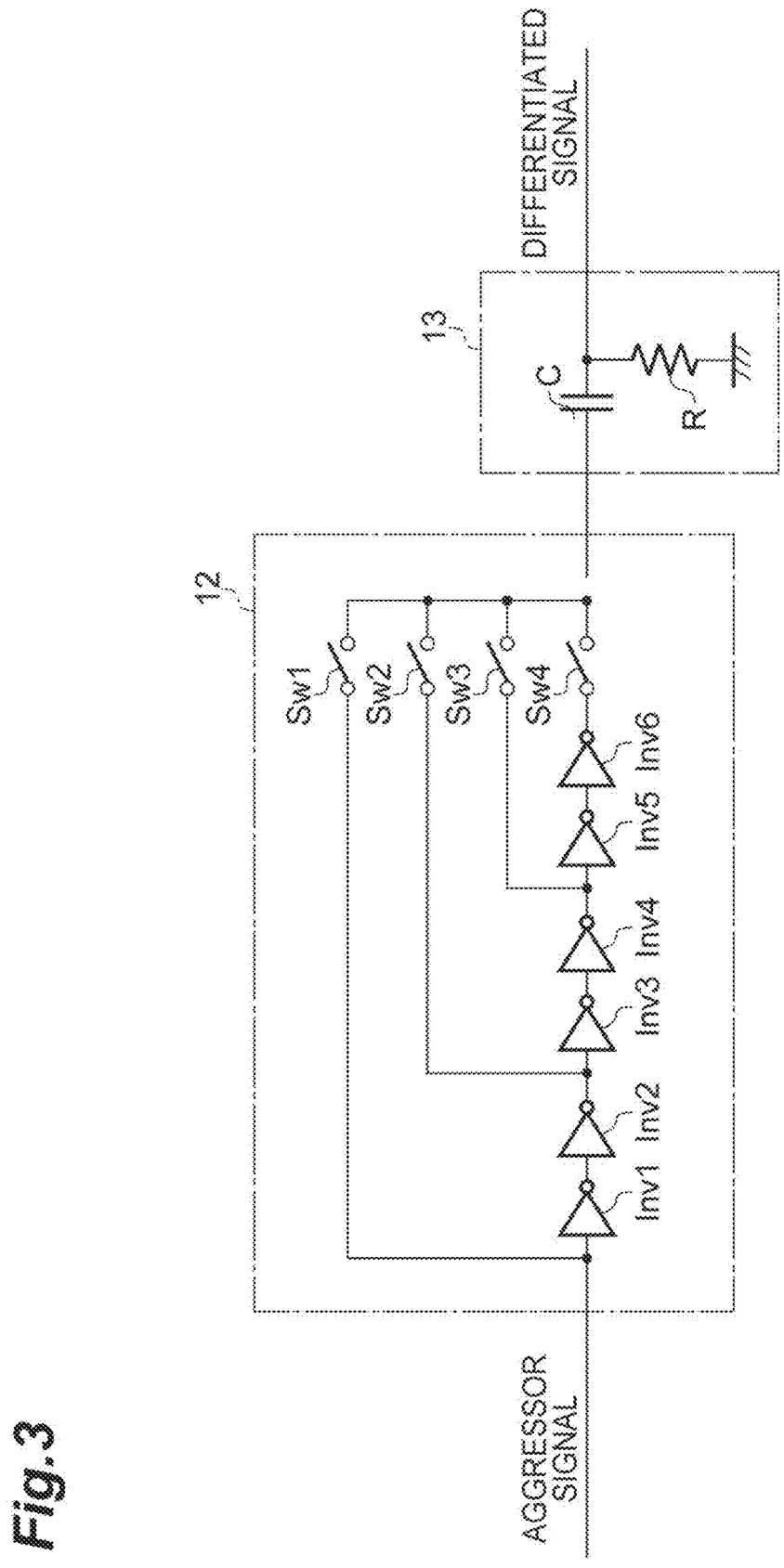
FIG. 3 is a diagram illustrating an example of the circuit configuration of a delay circuit 12 and a differentiated signal generating circuit 13.

FIG. 3 is a diagram illustrating an example of the circuit configuration of the delay circuit 12 and the differentiated signal generating circuit 13 (differentiating circuit). The delay circuit 12 includes six inverters Inv1 to Inv6 and four switches Sw1 to Sw4. The six inverters Inv1 to Inv6 are connected in series. The switch Sw1 is provided between the input terminal of the delay circuit 12 and the output terminal of the delay circuit 12. The switch Sw2 is provided between the output terminal of the second-stage inverter Inv2 and the output terminal of the delay circuit 12. The switch Sw3 is provided between the output terminal of the fourth-stage inverter Inv4 and the output terminal of the delay circuit 12. The switch Sw4 is provided between the output terminal of the final-stage inverter Inv6 and the output terminal of the delay circuit 12. When any one of the switches Sw1 to Sw4 is turned on, the other switches are turned off. The number of inverters from the input terminal to the output terminal of the delay circuit 12 can be made different depending on which of the switches Sw1 to Sw4 is turned on, so that the delay given to the aggressor signal can be made variable.

The differentiated signal generating circuit 13 includes a capacitor C and a resistor R. The capacitor C is provided between the input terminal and the output terminal of the differentiated signal generating circuit 13. The resistor R is provided between the output terminal of the differentiated signal generating circuit 13 and the ground potential terminal. The differentiated signal generating circuit 13 configured as described above operates as a high pass filter, but can generate a signal (differentiated signal) having a waveform that approximates the differentiated waveform of the input signal. As an example, the capacitance value of the capacitor C is 37 fF, and the resistance value of the resistor R is 300Ω.

Figure 4:
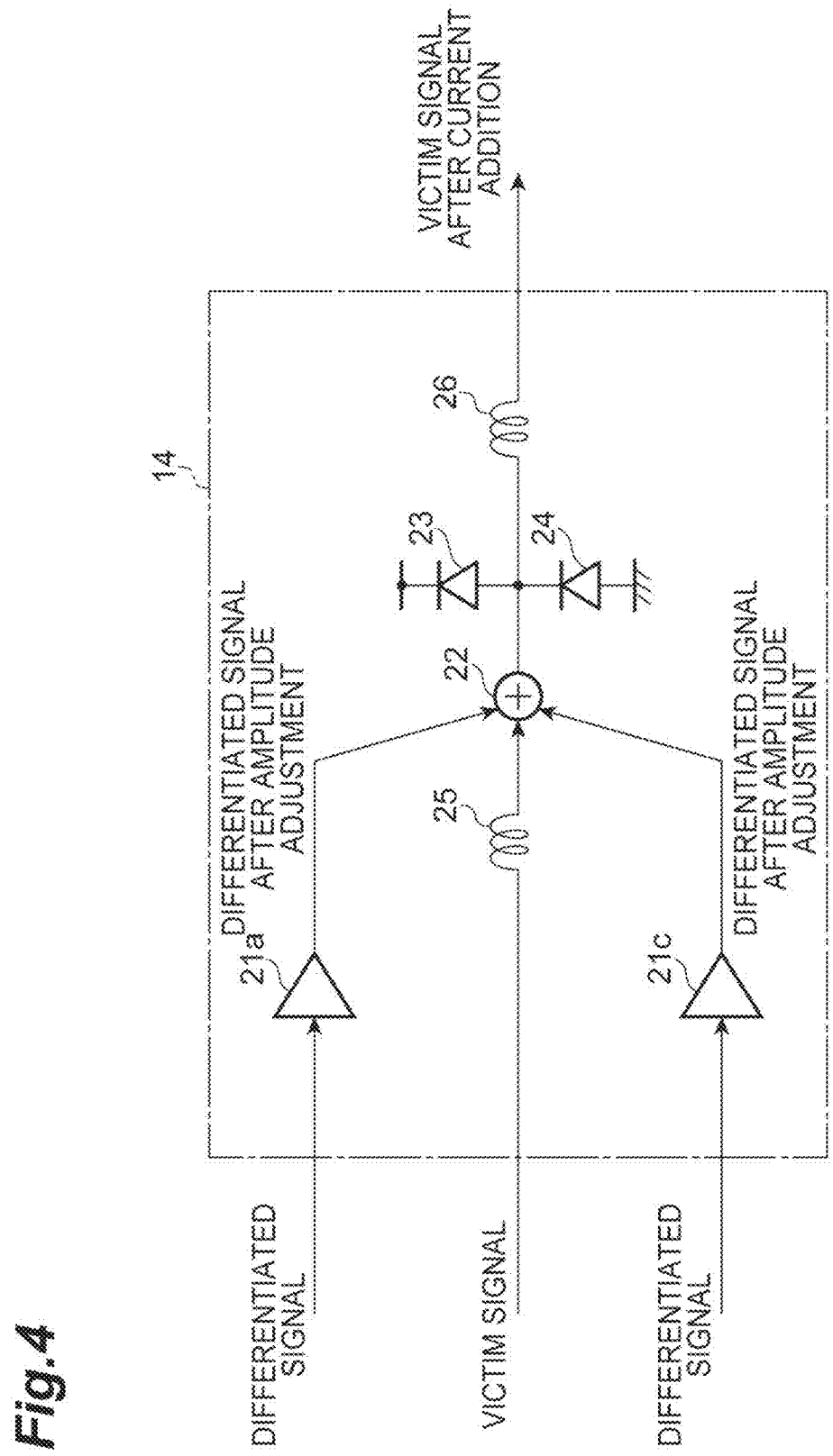
FIG. 4 is a diagram illustrating the configuration of an amplitude adjusting and adding circuit 14.

FIG. 4 is a diagram illustrating the configuration of the amplitude adjusting and adding circuit 14. The amplitude adjusting and adding circuit 14 includes variable gain amplifiers 21a and 21c and an adder 22. The variable gain amplifier 21a adjusts the amplitude of the differentiated signal generated by the differentiated signal generating circuit 13ab, and outputs the amplitude-adjusted differentiated signal as a current signal. The variable gain amplifier 21c adjusts the amplitude of the differentiated signal generated by the differentiated signal generating circuit 13cb, and Outputs the amplitude-adjusted differentiated signal as a current signal. The amplitude adjustment amount (gain) in the variable gain amplifiers 21a and 21c is variable. That is, not only can the amplitude adjustment amount (gain) in the variable gain amplifiers 21a and 21c be greater than 1, but also the amplitude adjustment amount (gain) in the variable gain amplifiers 21a and 21c may be 1 or less or may be a negative value. The adder 22 current-adds the differentiated signal (current signal), which has been amplitude-adjusted and output from each of the variable gain amplifiers 21a and 21c, to the victim signal, and outputs a victim signal after the addition.

FIG. 4 also illustrates ESD protection diodes 23 and 24 and inductors 25 and 26. The ESD protection diode 23 is provided between the output terminal of the adder 22 and the power supply potential terminal. The ESD protection diode 24 is provided between the output terminal of the adder 22 and the ground potential terminal. The inductor 25 is provided on the path of the victim signal input to the adder 22. The inductor 26 is provided on the path of the victim signal output from the adder 22. The inductors 25 and 26 form a T-coil, and cancel the load capacitance (capacitance of the ESD protection diodes 23 and 24 and the like) at the output terminal of the adder 22 (that is, the Output terminal of the XTC circuit 10). Therefore, it is possible to enlarge the output signal band by reducing the output return loss or the insertion loss.

Figure 5:
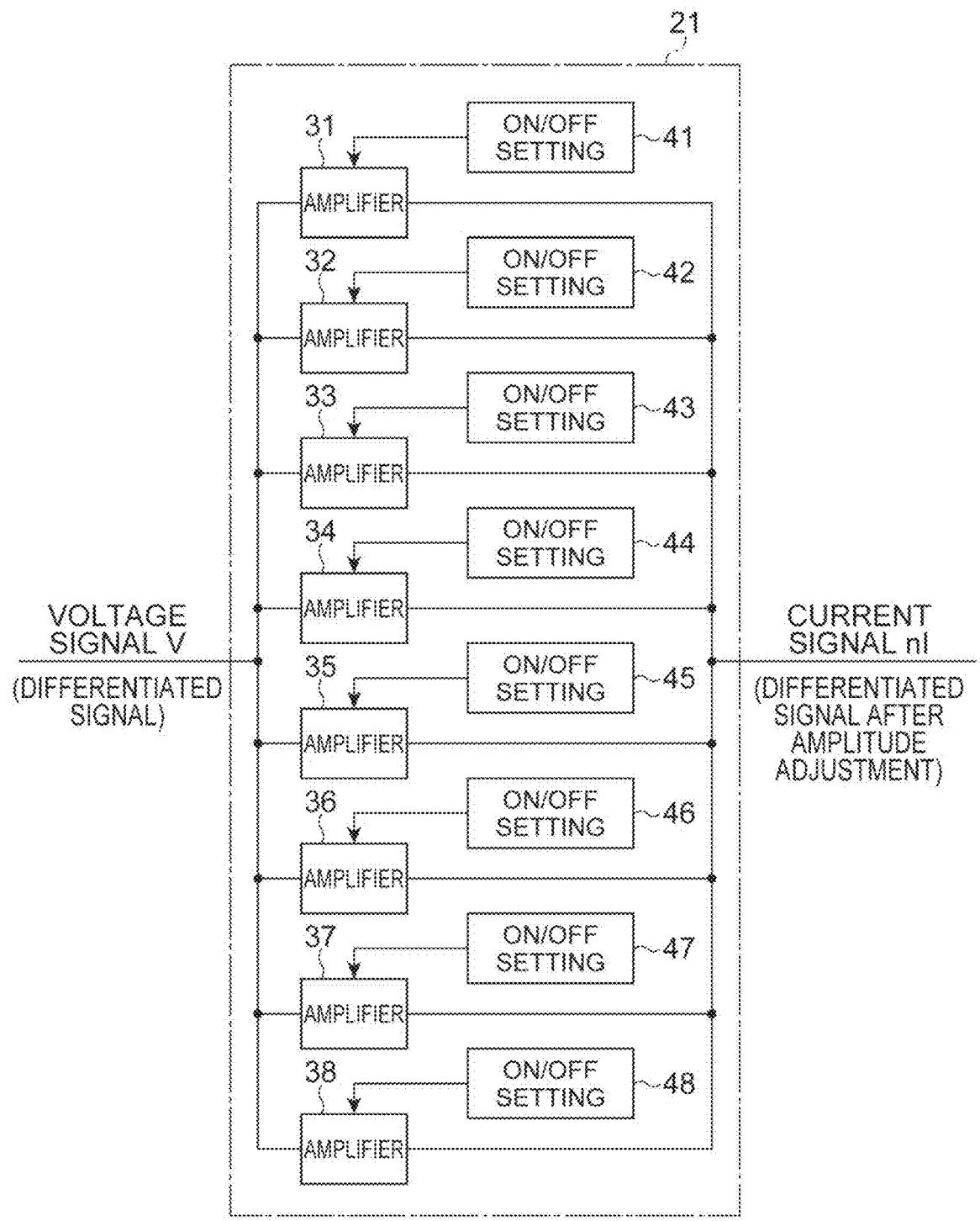
FIG. 5 is a diagram illustrating the configuration of a variable gain amplifier 21.

The variable gain amplifiers 21a and 21c can have a common configuration, and will hereinafter be referred to as a variable gain amplifier 21. FIG. 5 is a diagram illustrating the configuration of the variable gain amplifier 21. The variable gain amplifier 21 includes eight amplifiers 31 to 38 and eight ON/OFF setting circuits 41 to 48. The eight amplifiers 31 to 38 can have a common configuration, and the eight ON/OFF setting circuits 41 to 48 can also have a common configuration. The eight ON/OFF setting circuits 41 to 48 may share some partial circuits.

The input terminal of each of the amplifiers 31 to 38 is connected to the input terminal of the variable gain amplifier 21, so that a differentiated signal (voltage signal V) is input thereto. The output terminal of each of the amplifiers 31 to 38 is connected to the output terminal of the variable gain amplifier 21. Each of the amplifiers 31 to 38 can be turned on/off by a corresponding ON/OFF setting circuit among the ON/OFF setting circuits 41 to 48. Each of the amplifiers 31 to 38 outputs a current signal I corresponding to the input voltage signal V from the output terminal when set to ON, and does not output the current signal I from the output terminal when set to OFF. Assuming that the number of amplifiers 31 to 38 that are turned on is n, the current signal output from the output terminal of the variable gain amplifier 21 is nI. The variable gain amplifier 21 can set the amplitude adjustment amount of the differentiated signal by turning on/off each of the amplifiers 31 to 38.

Figure 6:
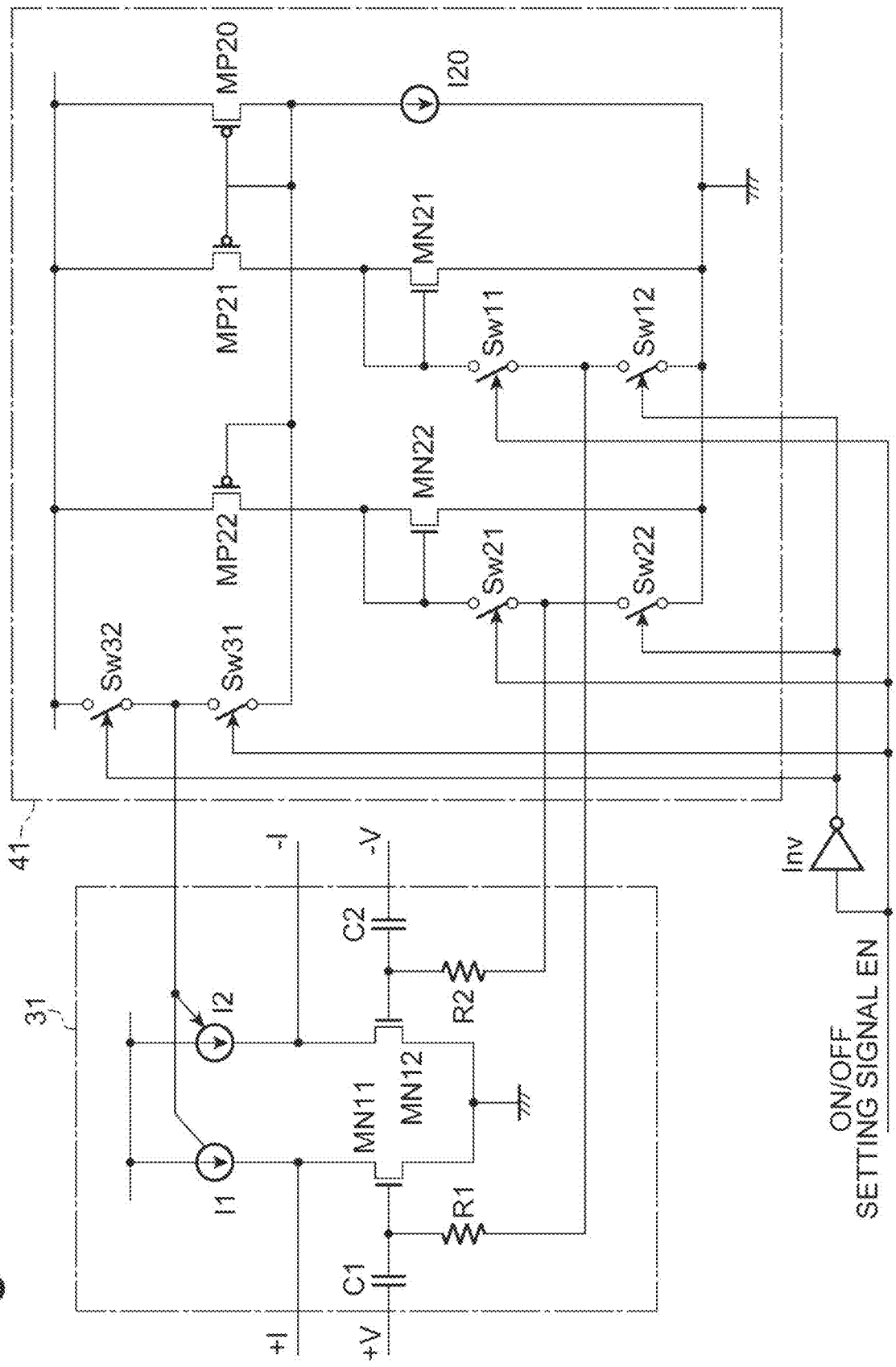
FIG. 6 is a diagram illustrating an example of the circuit configuration of an amplifier 31 and an ON/OFF setting circuit 41.

FIG. 6 is a diagram illustrating an example of the circuit configuration of the amplifier 31 and the ON/OFF setting circuit 41. In addition, it is assumed herein that the aggressor signal and the victim signal are differential signals and each signal generated from these signals is also differential signals.

The amplifier 31 includes current sources I1 and I2, NMOS transistors MN11 and MN12, capacitors C1 and C2, and resistors R1 and R2. The current source I1 is provided between the power supply potential terminal and the drain of the NMOS transistor MN11. The current source I2 is provided between the power supply potential terminal and the drain of the NMOS transistor MN12. Each of the current sources I1 and I2 can be implemented so as to include a PMOS transistor. The sources of the NMOS transistors MN11 and MN12 are connected to the ground potential terminal.

The magnitude of the current flowing from each of the current sources I1 and I2 is controlled by the bias voltage supplied from the ON/OFF setting circuit 41. The bias voltage is applied from the ON/OFF setting circuit 41 to the gate of the NMOS transistor MN11 through the resistor R1. The bias voltage is applied from the ON/OFF setting circuit 41 to the gate of the NMOS transistor MN12 through the resistor R2.

The capacitor C1 is provided between an input terminal, through which one signal (+V) of the input differential signals is input, and the gate of the NMOS transistor MN11. The capacitor C2 is provided between an input terminal, through which the other signal (−V) of the input differential signals is input, and the gate of the NMOS transistor MN12. The drain of the NMOS transistor MN11 is connected to an output terminal through which one signal (+I) of the output differential signals is output. The drain of the NMOS transistor MN12 is connected to an output terminal through which the other signal (−I) of the output differential signals is output.

The ON/OFF setting circuit 41 includes an inverter Inv, a current source I20, PMOS transistors MP20, MP21, and MP22, NMOS transistors MN21 and MN22, and switches Sw11, Sw12, Sw21, Sw22, Sw31, and Sw32. Among these, the current source I20 and the PMOS transistor MP20 can be shared by the eight ON/OFF setting circuits 41 to 48.

The sources of the PMOS transistors MP20, MP21, and MP22 are connected to the power supply potential terminal. The sources of the NMOS transistors MN21 and MN22 are connected to the ground potential terminal.

The drain of the PMOS transistor MP20 is connected to the gates of the PMOS transistors MP20, MP21, MP22, and is connected to the switch Sw31. The switch Sw32 is provided between the switch Sw31 and the power supply potential terminal. The current source I20 is provided between the drain of the PMOS transistor MP20 and the ground potential terminal.

The drain of the NMOS transistor MN21 is connected to the drain of the PMOS transistor MP21, the gate of the NMOS transistor MN21, and the switch SW11. The switch Sw12 is provided between the switch Sw11 and the ground potential terminal.

The drain of the NMOS transistor MN22 is connected to the drain of the PMOS transistor MP22, the gate of the NMOS transistor MN22, and the switch Sw21. The switch Sw22 is provided between the switch Sw21 and the ground potential terminal.

The current source I20, the PMOS transistors MP20 and MP21, and the NMOS transistor MN21 form a current minor circuit. The current source I20, the PMOS transistors MP20 and MP22, and the NMOS transistor MN22 form a current mirror circuit.

The inverter Inv generates a logically inverted signal of an ON/OFF setting signal EN. Each of the switches Sw11, Sw12, Sw21, Sw22, Sw31, and Sw32 is turned on or off according to the level of the ON/OFF setting signal EN. The switches Sw11, Sw21, and Sw31 are turned on when the ON/OFF setting signal EN is at a high level. The switches Sw12, Sw22, and Sw32 are turned on when the ON/OFF setting signal EN is at a low level (that is, when the signal applied from the inverter Inv is at a high level).

The relationship between the amplifier 31 and the ON/OFF selling circuit 41 is as follows. A connection point between the switches Sw11 and SW12 is connected to the gate of the NMOS transistor MN11 through the resistor R1 of the amplifier 31. A connection point between the switches Sw21 and Sw22 is connected to the gate of the NMOS transistor MN12 through the resistor R2 of the amplifier 31. A connection point between the switches Sw31 and Sw32 is connected to the current sources I1 and I2 of the amplifier 31.

When the ON/OFF setting signal EN is at a low level, the switches Sw11, Sw21, and Sw31 are turned off, and the switches Sw12, Sw22, and Sw32 are turned on. At this time, in the amplifier 31, the ground potential is applied to the gates of the NMOS transistors MN11 and MN12. In addition, the power supply potential is applied to the gate of each PMOS transistor forming the current sources I1 and I2. Therefore, even when the amplifier 31 is turned off and the signal (±V) is input to the input terminal, the level ΔI of the signal output from the Output terminal is 0.

When the ON/OFF setting signal EN is at a high level, the switches Sw11, Sw21, and Sw31 are turned on, and the switches Sw12, Sw22, and Sw32 are turned off. At this time, in the amplifier 31, the same potential as the gate potential of each of the NMOS transistors MN21 and MN22 is applied as a bias to the gate of each of the NMOS transistors MN11 and MN12. In addition, the same potential as the gate potential of each of the PMOS transistors MP20, MP21, and MP22 is applied to the gate of each PMOS transistor forming the current sources I1 and I2. Therefore, when the amplifier 31 is turned on and the signal (±V) is input to the input terminal, the signal (±I) corresponding to the input signal is output from the output terminal.

Assuming that the ON/OFF setting signal EN input to "n" ON/OFF setting circuits among the eight ON/OFF setting circuits 41 to 48 is at a high level and the ON/OFF setting signal EN input to the other ON/OFF setting circuits is at a low level, the current signal output from the output terminal of the variable gain amplifier 21 is nI, which is the sum of the current signals output from the amplifiers in the ON state. Therefore, the amplitude adjustment amount of the differentiated signal in the variable gain amplifier 21 can be set by changing the value of n.

Figure 7:
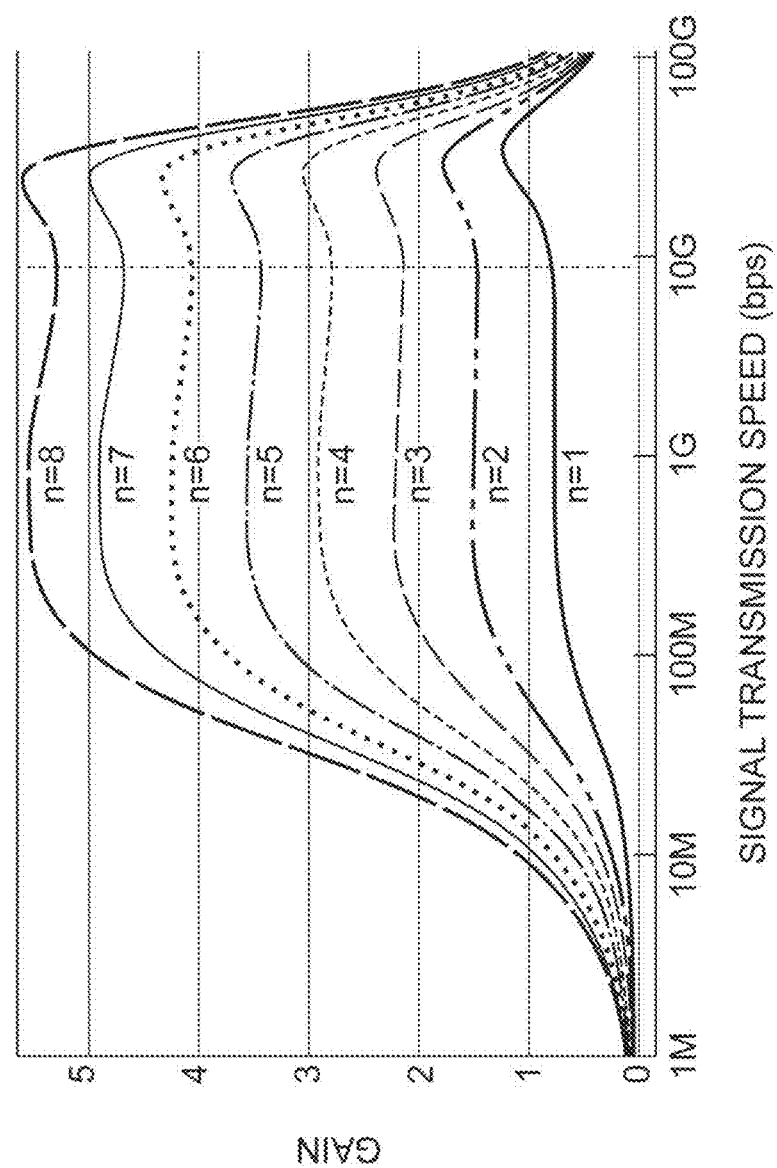
FIG. 7 is a graph showing a result obtained by performing simulation on the relationship between the amplitude adjustment amount and the signal transmission speed in the variable gain amplifier 21.

FIG. 7 is a graph showing a result obtained by performing simulation on the relationship between the amplitude adjustment amount and the signal transmission speed in the variable gain amplifier 21. The variable gain amplifier 21 has a circuit configuration illustrated in FIGS. 5 and 6, the magnitude of the current supplied from the current source I20 of the ON/OFF setting circuit is 100 μA, and the magnitude of the current supplied from each of the current sources I1 and I2 of the amplifier at the time of ON setting is set to 0.5 mA. The output current signal is observed as a voltage signal by the terminating resistor in the output buffer of the latter stage, and the ratio between the observed voltage signal and the input voltage signal is the amplitude adjustment amount (gain). FIG. 7 shows a relationship between the amplitude adjustment amount and the signal transmission speed for each value of n=1 to 8, with the horizontal axis indicating the signal transmission speed and the vertical axis indicating the amplitude adjustment amount. As shown in this graph, the larger the number n of amplifiers that are turned on, the larger the amplitude adjustment amount. For example, assuming that the signal transmission speed is 8 Gbps, the amplitude adjustment amount is 0.078 times when n=1, whereas the amplitude adjustment amount is 0.53 times when n=8.

Figure 8C:
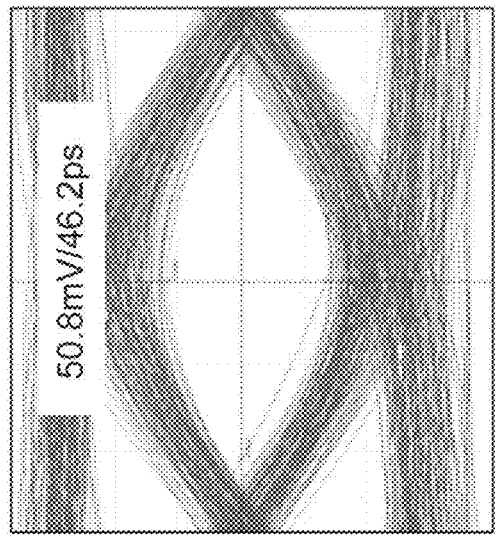
FIGS. 8A, 8B, and 8C are diagrams illustrating results obtained by simulating the operation of the XTC circuit 10, where
Figure 8B:
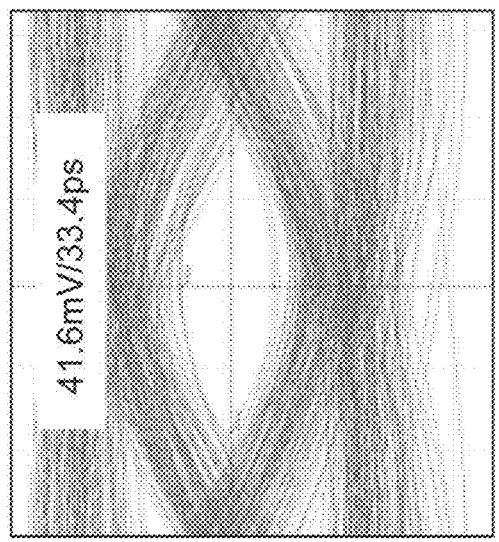
Figure 8A:
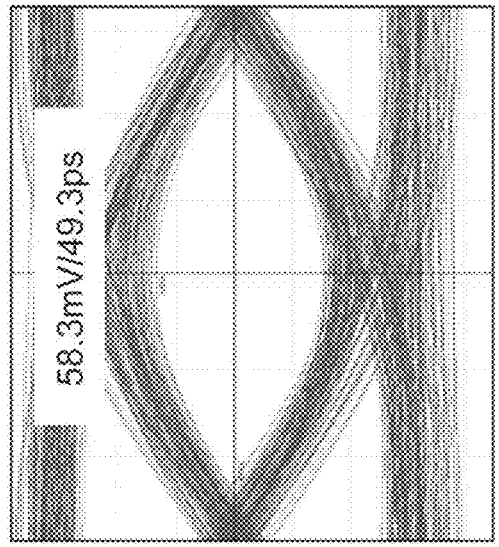

FIGS. 8A, 8B, and 8C are diagrams illustrating results obtained by simulating the operation of the XTC circuit 10. FIG. 8A illustrates the eye pattern of a signal after gain equalization in the receiver when there is no crosstalk. FIGS. 8B and 8C illustrate the eye pattern of a signal on the central signal line in the receiver when there is crosstalk between three signal lines arranged in parallel. FIG. 8B illustrates an eye pattern when XTC is not performed. FIG. 8C illustrates an eye pattern when XTC is performed according to the present embodiment. Compared with the eye pattern illustrated in FIG. 8B, the eye pattern illustrated in FIG. 8C has FEXT canceled, so that the eye is opened and the margin is restored.

The XIV circuit 10 according to the present embodiment can perform suitable XTC even when the I-coil (inductors 25 and 26) is provided at the output terminal. That is, in order to appropriately set the amplitude adjustment amount of the differentiated signal of the aggressor signal in the variable gain amplifier 21, even if the number n of amplifiers to be turned on among the plurality of amplifiers 31 to 38 included in the variable gain amplifier 21 is changed, the load capacitance at the output terminal does not change. Therefore, it is possible to improve both the normal signal characteristics and the XTC characteristics by the T-coil. The XTC circuit 10 can be appropriately provided in the transmitter 2. In addition, the transmission and reception system 1 including the transmitter 2 and the receiver 3 can be appropriately provided in a device, such as a television receiver.

The invention is not limited to the above embodiment, but various modifications can be made. Hereinafter, modification examples of the present embodiment will be described.

FIG. 9 is a diagram illustrating the configuration of an XTC circuit 10A. The configuration of the XTC circuit 10A illustrated in FIG. 9 is different from the configuration of the XTC circuit 10 illustrated in FIG. 2 in that an adder circuit 15 for adding up the differentiated signals output from the differentiated signal generating circuit 13ab and the differentiated signal generating circuit 13cb is further provided. The adder circuit 15 can add up the two differentiated signals by capacitive coupling. In the amplitude adjusting and adding circuit 14b, a differentiated signal output after addition by the adder circuit 15 is amplitude-adjusted to become a current signal, and a differentiated signal after the amplitude adjustment is current-added to the signal Db. The amplitude adjusting and adding circuit 14b can have the same configuration as the amplitude adjusting and adding circuits 14a and 14c. The amplitude adjusting and adding circuit 14b of the XTC circuit 10 illustrated in FIG. 2 includes two variable gain amplifiers 21, whereas the amplitude adjusting and adding circuit 14b of the XTC circuit 10A illustrated in FIG. 9 only needs to include one gain variable amplifier 21, but a wider input/output dynamic range is required.

FIG. 10 to FIG. 14 show diagrams illustrating other circuit configuration examples of the amplifiers 31 to 38. In addition, the circuit configuration example of the amplifier illustrated in FIG. 10 corresponds to the circuit configuration example of the amplifier illustrated in FIG. 6 with the reversed conductivity type. In addition, the circuit configuration example of the amplifier illustrated in FIG. 13 corresponds to the circuit configuration example of the amplifier illustrated in FIG. 12 with the reversed conductivity type.

Figure 10:
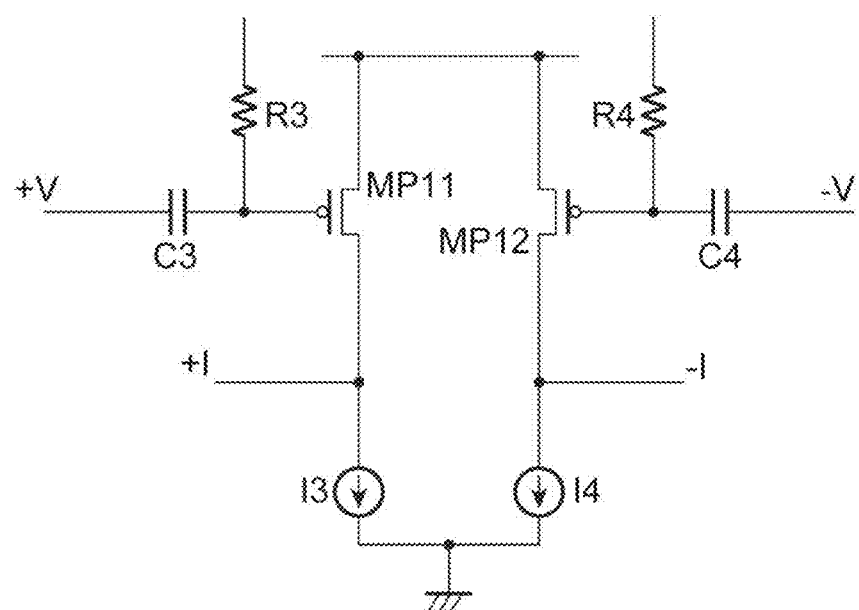
FIG. 10 is a diagram illustrating another circuit configuration example of the amplifier.

The amplifier of the circuit configuration example illustrated in FIG. 10 includes current sources I3 and I4, PMOS transistors MP11 and MP12, capacitors C3 and C4, and resistors R3 and R4. The current source I3 is provided between the ground potential terminal and the drain of the PMOS transistor MP11. The current source I4 is provided between the ground potential terminal and the drain of the PMOS transistor MP12. Each of the current sources I3 and I4 can be implemented so as to include an NMOS transistor. The sources of the PMOS transistors MP11 and MP12 are connected to the power supply potential terminal.

The magnitude of the current flowing from each of the current sources I3 and I4 is controlled by the bias voltage supplied from the ON/OFF setting circuit. The bias voltage is applied from the ON/OFF setting circuit to the gate of the PMOS transistor MP11 through the resistor R3. The bias voltage is applied from the ON/OFF setting circuit to the gate of the PMOS transistor MP12 through the resistor R4.

The capacitor C3 is provided between an input terminal, through which one signal (+V) of the input differential signals is input, and the gate of the PMOS transistor MP11. The capacitor C4 is provided between an input terminal, through which the other signal (−V) of the input differential signals is input, and the gate of the PMOS transistor MP12. The drain of the PMOS transistor MP11 is connected to an output terminal through which one signal (+I) of the output differential signals is output. The drain of the PMOS transistor MP12 is connected to an output terminal through which the other signal (−I) of the output differential signals is output.

Figure 11:
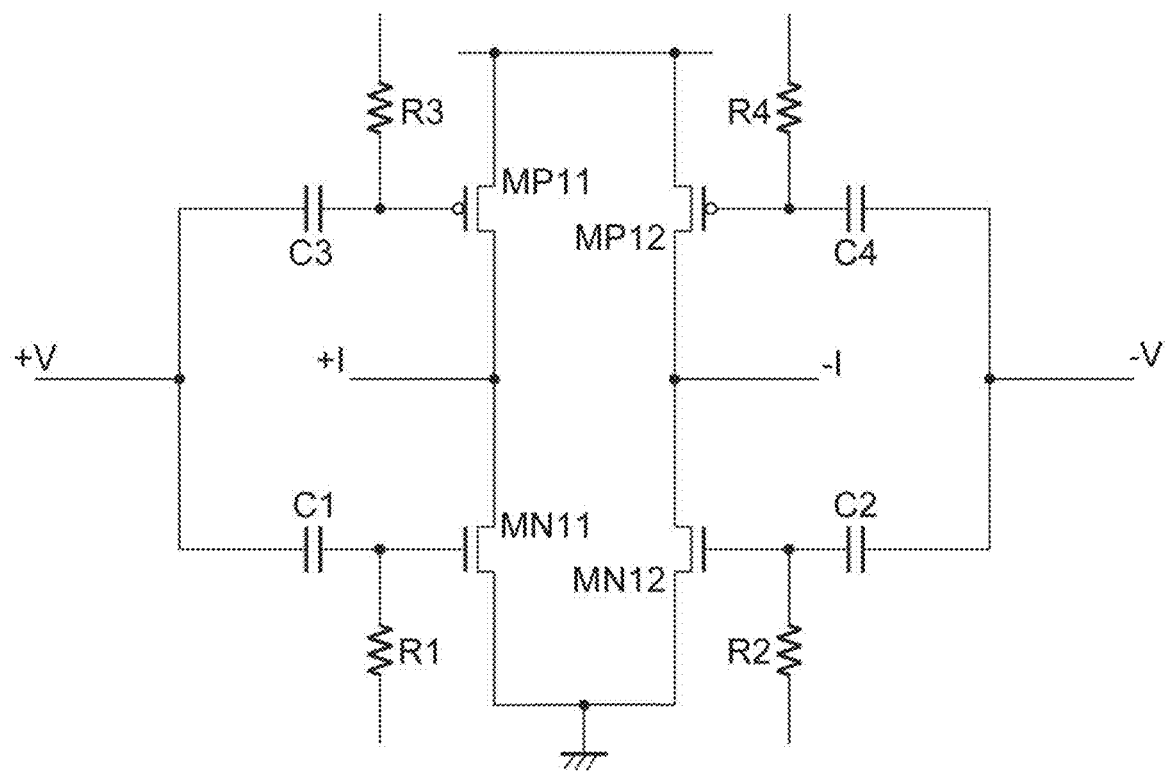
FIG. 11 is a diagram illustrating still another circuit configuration example of the amplifier.

The amplifier of the circuit configuration example illustrated in FIG. 11 includes NMOS transistors MN11 and MN12, PMOS transistors MP11 and MP12, capacitors C1 to C4, and resistors R1 to R4. Between the power supply potential terminal and the ground potential terminal, the PMOS transistor MP11 and the NMOS transistor MN11 are provided in series, and the PMOS transistor MP12 and the NMOS transistor MN12 are provided in series.

The bias voltage is applied from the ON/OFF setting circuit to the gate of the NMOS transistor MN11 through the resistor R1. The bias voltage is applied from the ON/OFF setting circuit to the gate of the NMOS transistor MN12 through the resistor R2. The bias voltage is applied from the ON/OFF setting circuit to the gate of the PMOS transistor MP11 through the resistor R3. The bias voltage is applied from the ON/OFF setting circuit to the gate of the PMOS transistor MP12 through the resistor R4.

The capacitor C1 is provided between an input terminal, through which one signal (+V) of the input differential signals is input, and the gate of the NMOS transistor MN11. The capacitor C2 is provided between an input terminal, through which the other signal (−V) of the input differential signals is input, and the gate of the NMOS transistor MN12. The capacitor C3 is provided between an input terminal, through which one signal (+V) of the input differential signals is input, and the gate of the PMOS transistor MP11. The capacitor C4 is provided between an input terminal, through which the other signal (−V) of the input differential signals is input, and the gate of the PMOS transistor MP12.

The drains of the NMOS transistor MN11 and the PMOS transistor MP11 are connected to the output terminal through which one signal (+I) of the output differential signals is output. The drains of the NMOS transistor MN12 and the PMOS transistor MP12 are connected to the output terminal through which the other signal (−I) of the output differential signals is output.

Figure 12:
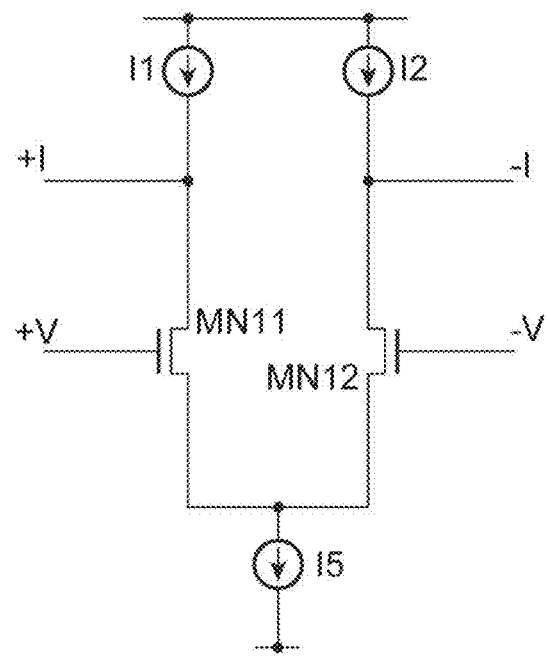
FIG. 12 is a diagram illustrating still another circuit configuration example of the amplifier.

The amplifier of the circuit configuration example illustrated in FIG. 12 includes current sources I1, I2, and I5 and NMOS transistors MN11 and MN12. The current source I1 is provided between the power supply potential terminal and the drain of the NMOS transistor MN11. The current source I2 is provided between the power supply potential terminal and the drain of the NMOS transistor MN12. The current source I5 is provided between the ground potential terminal and the sources of the NMOS transistors MN11 and MN12. The gate of the NMOS transistor MN11 is connected to an input terminal through which one signal (+V) of the input differential signals is input. The gate of the NMOS transistor MN12 is connected to an input terminal through which the other signal (−V) of the input differential signals is input. The drain of the NMOS transistor MN11 is connected to an output terminal through which one signal (+I) of the output differential signals is output. The drain of the NMOS transistor MN12 is connected to an output terminal through which the other signal (+I) of the output differential signals is output. ON/OFF of the amplifier is set by setting ON/OFF of the current sources I1, I2, and I5.

Figure 13:
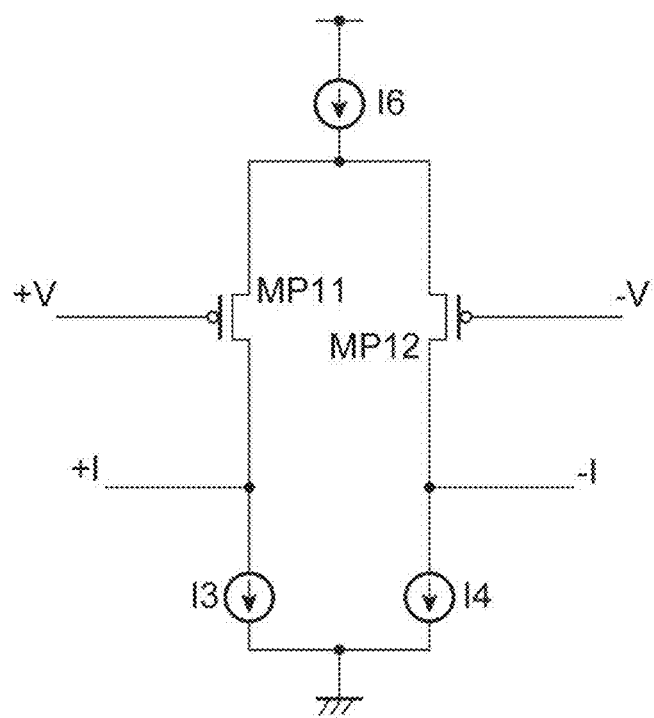
FIG. 13 is a diagram illustrating still another circuit configuration example of the amplifier.

The amplifier of the circuit configuration example illustrated in FIG. 13 includes current sources I3, I4, and I6 and PMOS transistors MP11 and MP12. The current source I3 is provided between the ground potential terminal and the drain of the PMOS transistor MP11. The current source I4 is provided between the ground potential terminal and the drain of the PMOS transistor MP12. The current source I6 is provided between the power supply potential terminal and the sources of the PMOS transistors MP11 and MP12. The gate of the PMOS transistor MP11 is connected to an input terminal through which one signal (+V) of the input differential signals is input. The gate of the PMOS transistor MP12 is connected to an input terminal through which the other signal (−V) of the input differential signals is input. The drain of the PMOS transistor MP11 is connected to an output terminal through which one signal (+I) of the output differential signals is output. The drain of the PMOS transistor MP12 is connected to an output terminal through which the other signal (−I) of the output differential signals is output. ON/OFF of the amplifier is set by setting ON/OFF of the current sources I3, I4, and I6.

Figure 14:
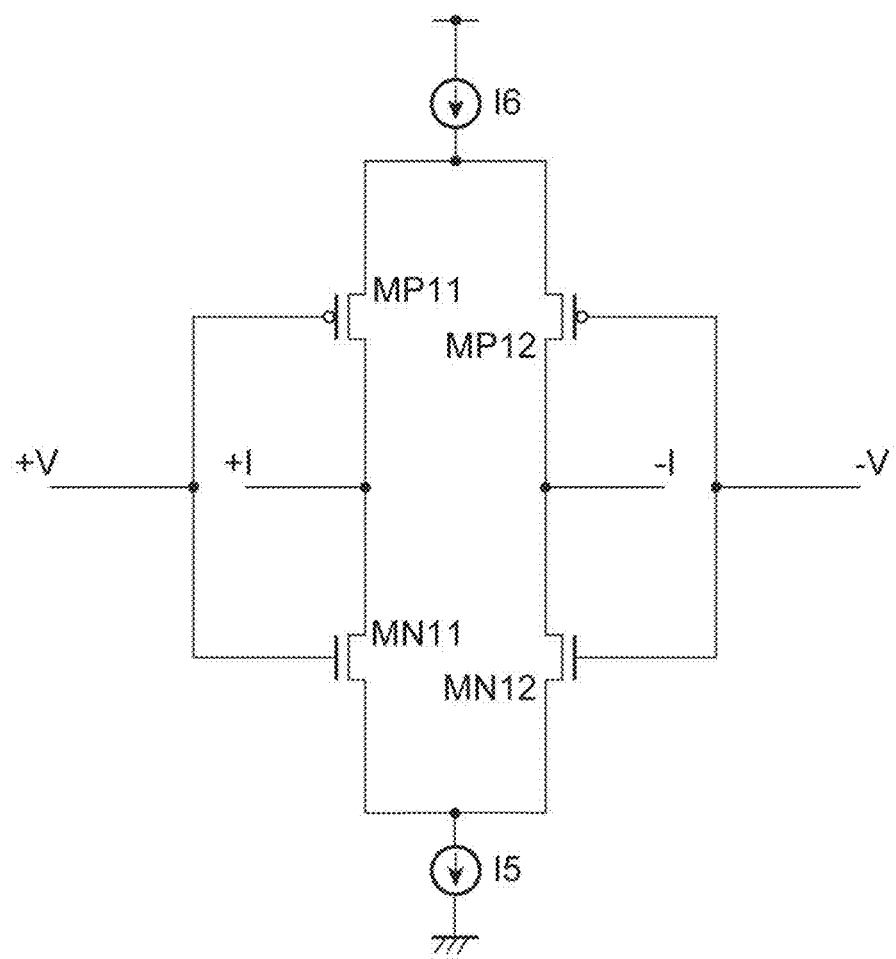
FIG. 14 is a diagram illustrating still another circuit configuration example of the amplifier.

The amplifier of the circuit configuration example illustrated in FIG. 14 includes current sources I5 and I6, NMOS transistors MN11 and MN12, and PMOS transistors MP11 and MP12. The current source I5 is provided between the ground potential terminal and the sources of the NMOS transistors MN11 and MN12. The current source I6 is provided between the power supply potential terminal and the sources of the PMOS transistors MP11 and MP12. The gates of the PMOS transistor MP11 and the NMOS transistor MN11 are connected to an input terminal through which one signal (+V) of the input differential signals is input. The gates of the PMOS transistor MP12 and the NMOS transistor MN12 are connected to an input terminal through which the other signal (−V) of the input differential signals is input. The drains of the PMOS transistor MP11 and the NMOS transistor MN11 are connected to each other, and are connected to an output terminal through which one signal (+I) of the output differential signals is output. The drains of the PMOS transistor MP12 and the NMOS transistor MN12 are connected to each other, and are connected to an output terminal through which the other signal (−I) of the output differential signals is output. ON/OFF of the amplifier is set by setting ON/OFF of the current sources I5 and I6.

In the circuit configuration examples of the amplifiers illustrated in FIGS. 12 to 14, since the current source is configured to include MOS transistors, three or four MOS transistors are provided in series between the power supply potential terminal and the ground potential terminal. Considering the voltage between the source and the drain of each MOS transistor, when the amplitude of the victim signal is small, it may be difficult to operate the MOS transistors forming the input differential pair in the saturation region. If the MOS transistors do not operate in the saturation region, the output impedance becomes small. As a result, the output differential signal (current signal) may differ between up and down parts, or the gain may be reduced. On the other hand, in the circuit configuration examples of the amplifiers illustrated in FIGS. 6, 10, and 11, two MOS transistors are provided in series between the power supply potential terminal and the ground potential terminal. Therefore, even if the amplitude of the victim signal is small, it is easy to operate the input differential pair in the saturation region, which is preferable.

The transmission and reception system 1 described above includes the transmitter 2, the receiver 3, the signal line 4, the crosstalk cancellation circuits (XTC circuits) 10 and 10A, the buffers 11a, 11b, and 11c, the delay circuits 12, 12ab, 12ba, 12bc, and 12cb, the differentiated signal generating circuits 13, 13ab, 13ba, 13bc, and 13cb, the amplitude adjusting and adding circuits 14, 14a, 14b, and 14c, the adder circuit 15, the variable gain amplifiers 21, 21a, and 21c, the adder 22, the ESD protection diode 23 and 24, the inductors 25 and 26, the amplifiers 31 to 38, and the ON/OFF setting circuits 41 to 48.

In addition, the connection between the respective element described above is an electrical connection, and the terminal on the input side of each element is an input terminal and the terminal on the output side thereof is an output terminal. As described above, the crosstalk cancellation circuit described above includes a first signal line (for example, a transmission line for the signal Db), a second signal line (for example, a transmission line for the signal Dc) arranged adjacent to the first signal line, a delay circuit (for example, 12cb) electrically connected to the second signal line (for example, a transmission line for the signal Dc), a differentiating circuit (for example, 13cb (differentiator)) electrically connected to the output terminal of the delay circuit (for example, 12cb), a variable gain amplifier (for example, 21c) electrically connected to the output terminal of the differentiating circuit (for example, 13cb), and the adder 22 including a first input terminal electrically connected to the first signal line (transmission line for the signal Db) and a second input terminal electrically connected to the output terminal of the variable gain amplifier (21c).

In addition, the crosstalk cancellation circuit described above further includes a first coil 25 connected in series to the first input terminal of the adder 22 and a second coil 26 connected in series to the output terminal of the adder 22.

In addition, the crosstalk cancellation circuit described above includes a first diode 23 electrically connected between the output terminal of the adder 22 and the power supply potential and a second diode 24 electrically connected between the output terminal of the adder 22 and the ground potential. The cathode of the first diode 23 is connected to the power supply potential, and the anode of the first diode 23 is connected to the output terminal of the adder 22. The anode of the second diode 24 is connected to the ground potential, and the cathode of the second diode 24 is connected to the output terminal of the adder 22. The first diode 23 and the second diode 24 are connected so that the current flows in the same direction.

What is claimed is:

1. A crosstalk cancellation circuit, comprising:
a delay circuit that adjusts a phase of a first signal among signals;
a differentiated signal generating circuit that generates a differentiated signal having a differentiated waveform of the first signal phase-adjusted by the delay circuit; and
an amplitude adjusting and adding circuit that
adjusts an amplitude of the differentiated signal generated by the differentiated signal generating circuit to obtain the differentiated signal as a current signal after the amplitude adjustment,
current-adds the differentiated signal after the amplitude adjustment to a second signal among the signals, and
outputs the second signal after the addition,
wherein said crosstalk cancellation circuit is provided in a transmitter that transmits the signals to a receiver through signal lines.

2. The crosstalk cancellation circuit according to claim 1, wherein the amplitude adjusting and adding circuit comprises amplifiers, each of the amplifiers including:
an input terminal, through which a voltage signal is input, and
an output terminal, through which a current signal corresponding to the voltage signal is output at a time of ON setting and is not output at a time of OFF setting;
wherein the amplitude adjusting and adding circuit inputs the differentiated signal generated by the differentiated signal generating circuit to the input terminal of each of the amplifiers;
wherein the amplitude adjusting and adding circuit current-adds a sum of the current signals output from the output terminals of the amplifiers to the second signal; and
wherein the amplitude adjusting and adding circuit sets an amplitude adjustment amount of the differentiated signal by setting ON/OFF of each of the amplifiers.

3. The crosstalk cancellation circuit according to claim 2, wherein each of the amplifiers includes:
a current source provided between a first potential terminal and the output terminal;
a Metal-Oxide-Semiconductor (MOS) transistor provided between a second potential terminal and the output terminal; and
a capacitor provided between a gate of the MOS transistor and the input terminal.

4. The crosstalk cancellation circuit according to claim 2, wherein each of the amplifiers includes:
a P-channel Metal-Oxide-Semiconductor (PMOS)transistor provided between a power supply potential terminal and the output terminal;
an N-channel Metal-Oxide-Semiconductor (NMOS)transistor provided between a ground potential terminal and the output terminal;

a first capacitor provided between a gate of the PMOS transistor and the input terminal; and
a second capacitor provided between a gate of the NMOS transistor and the input terminal.

5. The crosstalk cancellation circuit according to claim 2, wherein the input voltage signal comprises differential signals including:
a first voltage signal, and
a second voltage signal;
wherein the output current signal comprises differential signals including:
a first current signal, and
a second current signal; and
wherein each of the amplifiers includes:
a first current source provided between a first potential terminal and a first output terminal through which the first current signal is output,
a second current source provided between the first potential terminal and a second output terminal through which the second current signal is output,
a third current source connected to a second potential terminal,
a first Metal-Oxide-Semiconductor (MOS) transistor that has a gate connected to a first input terminal, through which the first voltage signal is input, and is provided between the third current source and the first output terminal, and
a second Metal-Oxide-Semiconductor (MOS) transistor that has a gate connected to a second input terminal, through which the second voltage signal is input, and is provided between the third current source and the second output terminal.

6. The crosstalk cancellation circuit according to claim 2, wherein the input voltage signal comprises differential signals including:
a first voltage signal, and
a second voltage signal;
wherein the output current signal comprises differential signals including:
a first current signal, and
a second current signal, and
wherein each of the amplifiers includes:
a first current source connected to a power supply potential terminal,
a second current source connected to a ground potential terminal,
a first P-channel Metal-Oxide-Semiconductor (PMOS) transistor that has a gate connected to a first input terminal, through which the first voltage signal is input, and is provided between the first current source and a first output terminal, through which the first current signal is output,
a second P-channel Metal-Oxide-Semiconductor (PMOS) transistor that has a gate connected to a second input terminal, through which the second voltage signal is input, and is provided between the first current source and a second output terminal, through which the second current signal is output,
a first N-channel Metal-Oxide-Semiconductor (NMOS) transistor that has a gate connected to the first input terminal and is provided between the second current source and the first output terminal, and
a second N-channel Metal-Oxide-Semiconductor (NMOS) transistor that has a gate connected to the second input terminal and is provided between the second current source and the second output terminal.

7. A transmitter, comprising:
the crosstalk cancellation circuit according to claim 1.

8. A transmission and reception system, comprising:
the transmitter according to claim 7; and
the receiver that receives signals from the transmitter.

9. A crosstalk cancellation circuit, comprising:
a first signal line;
a second signal line arranged adjacent to the first signal line;
a delay circuit electrically connected to the second signal line;
a differentiating circuit electrically connected to an output terminal of the delay circuit;
a variable gain amplifier electrically connected to an output terminal of the differentiating circuit; and
an adder for adding input current signals, including a first input terminal electrically connected to the first signal line and a second input terminal electrically connected to an output terminal of the variable gain amplifier,
wherein said crosstalk cancellation is provided in a transmitter.

10. The crosstalk cancellation circuit according to claim 9, further comprising:
a first coil connected in series to the first input terminal of the adder; and
a second coil connected in series to an output terminal of the adder.

11. The crosstalk cancellation circuit according to claim 10, further comprising:
a first diode electrically connected between the output terminal of the adder and a power supply potential; and
a second diode electrically connected between the output terminal of the adder and a ground potential.

12. A crosstalk cancellation circuit, comprising:
a first signal line;
a second signal line arranged adjacent to the first signal line;
a delay circuit electrically connected to the second signal line;
a differentiating circuit electrically connected to an output terminal of the delay circuit;
a variable gain amplifier electrically connected to an output terminal of the differentiating circuit;
an adder including a first input terminal electrically connected to the first signal line and a second input terminal electrically connected to an output terminal of the variable gain amplifier;
a first coil connected in series to the first input terminal of the adder; and
a second coil connected in series to an output terminal of the adder.

13. The crosstalk cancellation circuit according to claim 12, further comprising:
a first diode electrically connected between the output terminal of the adder and a power supply potential; and
a second diode electrically connected between the output terminal of the adder and a ground potential.

* * * * *